(12) United States Patent
Kranz et al.

(10) Patent No.: US 6,771,711 B2
(45) Date of Patent: Aug. 3, 2004

(54) DIGITAL GMSK FILTER

(75) Inventors: Christian Kranz, Ratingen Lintorf (DE); Volker Christ, Neuss (DE)

(73) Assignee: Infineon Technologies AG, Munich (DE)

(*) Notice: Subject to any disclaimer, the term of this patent is extended or adjusted under 35 U.S.C. 154(b) by 448 days.

(21) Appl. No.: 10/033,134

(22) Filed: Oct. 22, 2001

(65) Prior Publication Data

US 2002/0089440 A1 Jul. 11, 2002

Related U.S. Application Data

(63) Continuation of application No. PCT/DE00/01121, filed on Apr. 11, 2000.

(30) Foreign Application Priority Data

Apr. 22, 1999 (DE) .......................................... 199 18 388

(51) Int. Cl.[7] .............................. H03C 3/00; H03K 7/06; H04L 27/12
(52) U.S. Cl. ........................ 375/305; 375/274; 375/216; 341/141; 341/153; 330/100
(58) Field of Search ................................ 375/274, 271, 375/302, 305, 336, 350, 216; 332/100–102; 341/141, 144, 150, 153

(56) References Cited

U.S. PATENT DOCUMENTS 5,515,047 A * 5/1996 Yamakido et al. .......... 341/153
5,815,537 A * 9/1998 Janssen ...................... 375/350
6,072,340 A * 6/2000 Deisch ........................ 327/100
6,542,100 B1 * 4/2003 Matter et al. ............... 341/153

FOREIGN PATENT DOCUMENTS

| EP | 0 743 759 A1 | 11/1996 |
| WO | WO 97/04525 | 2/1997 |
| WO | WO 97/33414 | 9/1997 |

OTHER PUBLICATIONS

U. Tietze et al.: "Halbleiter–Schaltungstechnik" [semiconductor circuit technology], Springer–Verlag Berlin, 8th ed., 1986, pp. 740–742.

* cited by examiner

Primary Examiner—Phoung Phu
(74) Attorney, Agent, or Firm—Laurence A. Greenberg; Werner H. Stemer; Gregory L. Mayback

(57) ABSTRACT

A digital GMSK filter for use for frequency modulation of a carrier signal in a GMSK transmission system is described. The GMSK filter uses a large number of individual current sources, whose current values are individually weighted. The current sources are driven via a control logic module using a shift register with a thermometer code, such that this results in a total current with a Gaussian characteristic, which is converted across a resistor to a voltage and drives a voltage controlled oscillator (VCO). The filter provides exact implementation of the sample values, virtually without any quantization error, and requires only a small chip area for its implementation.

5 Claims, 3 Drawing Sheets

| Current Source | Relative Current Values For Each Source | Sum of the Relative Current |
|---|---|---|
| - | - | 0 |
| I1 | 0.0173 | 0.0173 |
| I2 | 0.0282 | 0.0455 |
| I3 | 0.0173 | 0.0628* |
| I4 | 0.0398 | 0.1026 |
| I5 | 0.0974 | 0.2 |
| I6 | 0.1365 | 0.3365 |
| I7 | 0.1635 | 0.5 |
| I8 | 0.1636 | 0.6635 |
| I9 | 0.1365 | 0.8 |
| I10 | 0.0974 | 0.8974 |
| I11 | 0.0398 | 0.9372* |
| I12 | 0.0173 | 0.9545 |
| I13 | 0.0282 | 0.9827 |
| I14 | 0.0173 | 1.0 |

FIG 4

| 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|----|----|----|----|----|----|----|----|----|
| 0 | 0 | 0 | I1 | I2 | I3+I4 | I5 | I6 | I7 | I8 | I9 | I10 | I11+I12 | I13 | I14 | | | |

FIG 5

| 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|----|----|----|----|----|----|----|----|----|
| 0 | 0 | 0 | I1 | I2 | I3+I4 | I5 | I6 | I7 | I8 | I9 | I10 | I11 | | | | | |
| | | | | I3 | I3+I4 | I5 | I6 | I7 | I8 | I9 | I10 | I11 | | | | | |
| | | | | I3 | I3+I4 | I5 | I6 | I7 | | | | | | | | | |

FIG 6

| TXDA(n) | TXDA(n+1) | Shift Direction l = left, r = right |
|---|---|---|
| 0 | 0 | l |
| 0 | 1 | r |
| 1 | 0 | l |
| 1 | 1 | r |

FIG 7

| TXDA(n) | TXDA(n+1) | Shift Loop l = long, s = short |
|---|---|---|
| 0 | 0 | l |
| 0 | 1 | s |
| 1 | 0 | s |
| 1 | 1 | l |

DIGITAL GMSK FILTER

CROSS-REFERENCE TO RELATED APPLICATION

This application is a continuation of copending International Application No. PCT/DE00/01121, filed Apr. 11, 2000, which designated the United States.

BACKGROUND OF THE INVENTION

FIELD OF THE INVENTION

The present invention relates in general to modulation systems for frequency shift keying with an upstream Gaussian filter, referred to as Gaussian minimum shift keying (GMSK) modulation systems. In particular, it relates to an improved GMSK filter for such GMSK modulation systems.

GMSK modulation is frequently used in present-day cordless telephone systems or mobile radio systems. In these modulation systems, with an upstream Gaussian filter, referred to as GMSK modulation systems, a carrier signal is modulated with a Gaussian-filtered digital data signal. Frequency modulation (FM) or quadrature modulation may be used for modulation in this case. Since quadrature modulation requires linear I and Q paths which match one another very exactly, and also requires a phase shifter and a mixing module, it is relatively complex to implement. Thus, for cost reasons, frequency modulation is frequently used, since it is simpler to implement.

Frequency modulation uses a voltage controlled oscillator, referred to as a VCO. The digital data signal used for modulation is for this purpose filtered by a Gaussian filter. The Gaussian filter ensures that the digital square-wave signals, which represent the actual data signal, are smooth to a certain extent. To a certain extent, this represents a low-pass filter and ensures that no excessively abrupt sudden phase changes occur. It is thus possible to produce a relatively narrowband modulated carrier signal. The signal produced at the output of the Gaussian filter then drives the voltage controlled oscillator (VCO).

The Gaussian filter can be implemented in various ways. For example, it may be in the form of an analog filter element with discrete components, as is used in the Siemens cordless DECT telephones. Alternatively, it may be in the form of a digital filter, as is used, for example, in the Phillips and NSC cordless telephones.

In the GMSK filters normally used until now, digital preprocessing followed by digital/analog conversion was carried out by an X-bit digital/analog converter (D/A converter). As for any digital/analog conversion, the digital/analog conversion necessarily results in quantization errors due to the step function used in the D/A converter. The quantization errors can be reduced by reducing the size of the steps used in the D/A converter, by increasing its resolution and hence its bit length.

Conventional D/A converters, which operate on the current source principle, have binary-weighted current sources. The individual current sources in this case emit currents which represent a binary multiple of a reference current Iref. They thus have magnitudes Iref, 2*Iref, 4*Iref . . . 2^N*Iref. Any digital value can thus be produced by simple addition. One problem with these D/A converters is that, when switching to the most significant bit (MSB), switching is carried out from the sum of all the reference currents, apart from the largest reference current, to the largest reference current. If the reference currents are now not precisely matched, which is virtually always the situation in practice, there is a sudden change in the converter characteristic. This can result in the production of radio-frequency sideband signals, which contravene specified sideband suppression.

In D/A converters having a voltage output, reference voltages are added. The voltages can be added actively via a buffer, or passively via resistors. In the passive version, however, the output resistance is not constant, and has a relatively high value. Furthermore, resistors are not particularly suitable for integration, since they require a large surface area for their implementation. The voltages are therefore normally added via a buffer that requires a sufficiently wide bandwidth (in this case in the order of magnitude of 10 MHz). However, such a buffer also requires a relatively large surface area for its implementation, and consumes a large amount of current.

In addition, conventional D/A converters require a digital filter. This is frequently in the form of a table stored in a read only memory (ROM).

The GMSK filters that are used are intended to be implemented on a minimum surface area in the course of the ever greater miniaturization of electronic appliances. At the same time, however, the filters are intended to be as accurate as possible.

International Patent Disclosure WO 97/04525 describes a digital GMSK filter which adds currents from a large number of individual current sources to produce a total current which is converted to a corresponding voltage value by a resistor. The current sources, which are weighted in accordance with the desired filter function, are in this case driven via a shift register.

International Patent Disclosure WO 97/33414 A specifies a configuration for pulse-shaping for GMSK modulation. The digital data stream received by the configuration is converted by read only memories, logic circuits and a digital/analog converter to an analog control signal for a VCO.

A further digital-to-analog converter for producing a GMSK-weighted analog signal is described in Published, European Patent Application EP 0 743 759 A1.

SUMMARY OF THE INVENTION

It is accordingly an object of the invention to provide a digital GMSK filter which overcomes the above-mentioned disadvantages of the prior art devices of this general type, whose accuracy is as high as possible and which can be implemented on a minimal surface area.

With the foregoing and other objects in view there is provided, in accordance with the invention, a digital Gaussian minimum shift keying (GMSK) filter for frequency modulating a carrier signal in a GMSK transmission system. The GMSK filter contains a control logic module having a shift register receiving modulation bits. The shift register has a first side for receiving logic 1 values of the modulation bits and a second side receiving logic 0 values of the modulation bits. The second side is opposite the first side, and the shift register has a shift direction switchable between a stop, a left and a right shift direction. A number of individual current sources are provided and output individual current values with the individual current sources being individually driven by the control logic module in accordance with a digital signal to be modulated. An output resistor is coupled to the individual current sources with a total current from the individual current sources being converted by the output resistor to a voltage value for controlling a voltage controlled oscillator, by which a frequency of the carrier signal is modulated.

The object is achieved by the digital GMSK filter according to the invention. The filter uses a parallel D/A converter with a current output for the D/A converter. The analog output signal in this case consists of a total current, which is obtained by additive combination of individual currents from individual current sources.

The current sources that are used for the filter according to the invention are what are referred to as differential current sources. The expression "differential current source" is in this case intended to mean that they each supply the current which is necessary to move from one step on the converter characteristic to the next step. The necessary chip surface area to provide the filter is in this case governed only by the maximum total current, and not by the number of current sources.

The individual currents from the differential current sources can be converted directly in an external resistor to the control voltage required for driving the VCO, so that, in contrast to the D/A converters known from the prior art, no output buffer is required. The current values from the differential current sources are in this case not weighted linearly, but have Gaussian weighting. Therefore, there is no need for any digital filtering.

The configuration of the shift register according to the invention (input capability on both sides and capability to shift the switch direction) results in that the individual current sources can be driven in an advantageous manner.

Particularly when varactors are used for this purpose, voltage controlled oscillators (VCOs) have a wide scatter in their operating parameters. The drive voltage must therefore be trimmed during production, in order to achieve a predetermined frequency shift in the VCO. The modulation shift can be carried out, in the GMSK filter according to the invention, by trimming the reference current of the differential current sources.

Overall, the digital GMSK filter according to the invention provides a filter that can be implemented on a small chip surface area, which is governed only by the maximum total current. The filter does not require an output buffer. The Gaussian weighting of the currents from the differential current sources results in that there is no need for any digital filtering. Furthermore, this allows an exact Gaussian converter characteristic to be achieved.

In accordance with an added feature of the invention, the individual current values of the individual current sources are weighted such that the total current has a Gaussian characteristic, as a result of a respective connection and disconnection of in each case one of the individual current sources.

In accordance with another feature of the invention, the shift register is operable in a long loop mode, in which the shift register is always filled either entirely with "logic ones" or entirely with "logic zeros", and the shift register is operable in a short loop mode, in which the shift direction for specific positions in the shift register is changed, and a shift process is suppressed for one cycle.

In accordance with a further feature of the invention, for the long loop mode in the shift register, the shift direction is changed as a function of a next bit to be modulated.

Other features which are considered as characteristic for the invention are set forth in the appended claims.

Although the invention is illustrated and described herein as embodied in a digital GMSK filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a table showing which current sources in the GMSK filter according to the invention are switched successively for a modulation sequence with the values 0011;

FIG. 5 is a table showing which current sources in the GMSK filter according to the invention are switched successively for a modulation sequence with the values 00101;

FIG. 6 is a table showing how the shift direction of a shift register is set in order to drive the current sources; and FIG. 7 is a table showing a decision for passing through a long loop or a short loop of the shift register in order to drive the current sources.

DESCRIPTION OF THE PREFERRED EMBODIMENTS

Figure 1:
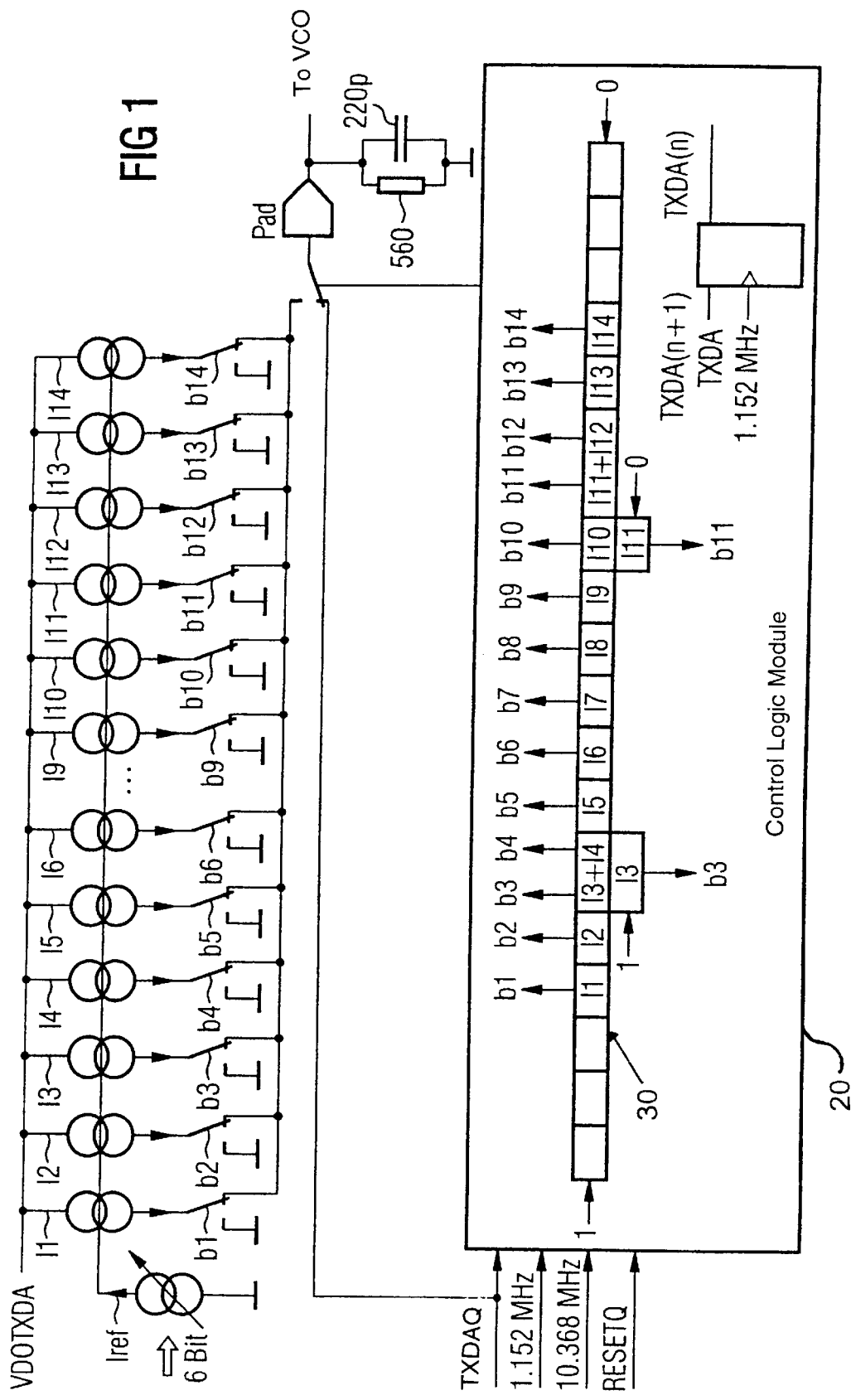
FIG. 1 is a schematic illustration of a digital GMSK filter according to the invention.

Referring now to the figures of the drawing in detail and first, particularly, to FIG. 1 thereof, there is shown a schematic illustration of a digital GMSK filter according to the invention. In its upper part, the GMSK filter has fourteen individual current sources, I1 to I14. Their individual, different current values are produced by a reference current Iref, and they can be connected individually to a common line via a total of fourteen switches b1 to b14.

The designation VDDTXDA in this case denotes the supply voltage for the current sources. An output resistor 560 is coupled to the current sources I1 to I14 through the switches b1 to b14 and converts a current value into a voltage value.

The lower part of FIG. 1 shows a control logic module 20 for switching the individual current sources I1–I14. The control logic module essentially contains a shift register 30, indicated by the individual cells. The logic for switching the current sources operates using an 18-bit thermometer code. In this case, a "logic 1" is shifted into the shift register from the left, and a "logic 0" from the right, as is indicated in the drawing by the "1" on the left-hand side of the shift register 30, and the "0" on the right-hand side of the shift register 30. A shift direction can be switched between "stop", "left" and "right". A shift clock in the exemplary embodiment illustrated here is 10.368 MHz and, as indicated here on the left-hand side of the logic module 20, is supplied to the control logic module 20 from the exterior. The details of the operation of the shift register 30 will be explained in more detail further below with reference to FIGS. 4 and 5. As indicated on the left-hand side of the module, the control logic module 20 is supplied, inter alia, with the signal TXDAQ, which represents a bit sequence to be transmitted, a 1.152 MHz clock which is the clock using which the bits to be transmitted arrive, and the shift clock at 10.368 MHz, as already mentioned above. Furthermore, the control logic module 20 also has an RESETQ input, by which it can be reset to a defined initial state. Underneath the shift register 30, a memory is also indicated in the control logic module, since the signal TXDA is required not only at the time n but also at the time n+1.

Figures 2, 3:
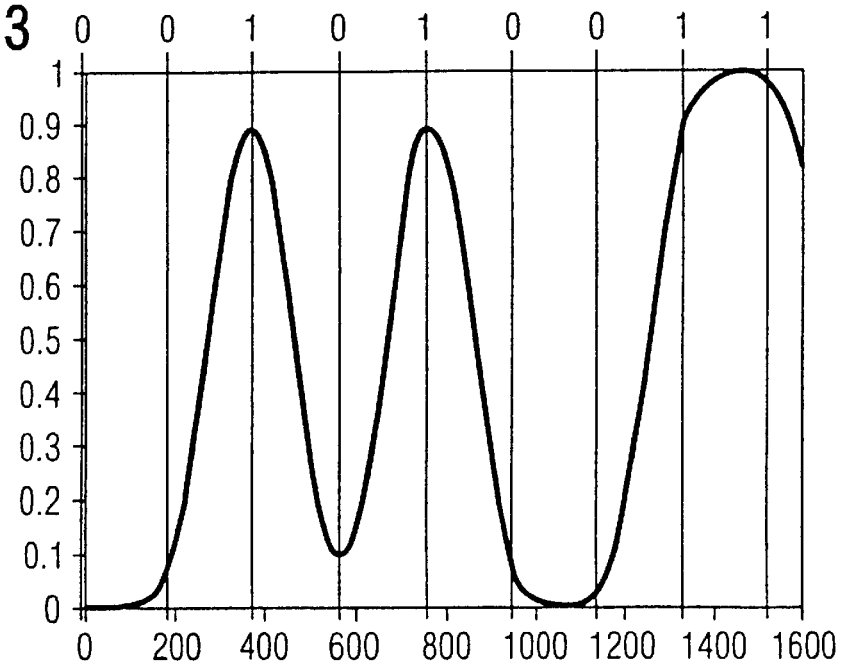
FIG. 2 is a table showing the dimensioning of current sources and of a total current resulting from an interconnection of current sources.
FIG. 3 is a graph showing an output signal from a GMSK modulator, in which the GMSK filter according to the invention has been used.

FIG. 2 is a table showing the dimensioning of the current sources and of a total current resulting from the interconnection of the current sources I1 to I14. The left-hand column shows the fourteen current sources I1 to I14 used here. The central column shows the current values for each individual current source. The current values from the individual current sources are chosen such that they can be used to produce a Gaussian converter characteristic, that is as free of errors as possible, by alternate interconnection of the current sources. The right-hand column shows the total current, which results from successive addition of the current elements from the individual current sources. The currents shown are relative values, that is to say they are variables normalized with respect to the total current value 1.0.

FIG. 3 shows an output signal from a GMSK modulator, in which the GMSK filter according to the invention has been used. An example of a sequence of binary values that are intended to be used for modulation is shown at the upper edge. This is the sequence 001010011. The lower horizontal axis is the time axis, and the left-hand vertical axis indicates the relative total current value.

FIG. 4 is a table showing which current sources are switched successively in the GMSK filter according to the invention for a modulation sequence with the value 0011. If the binary modulation values have the sequence 0011, what is referred to as a long loop, is carried out in the shift register, using the thermometer code.

FIG. 5 is a table showing which current sources are switched successively in the GMSK filter according to the invention for a modulation sequence with the values 00101. If the binary modulation values have the sequence 00101, what is referred to as a short loop is carried out in the shift register, using the thermometer code.

The code used in the shift register 30 for driving the individual current sources I1 to I14 is referred to as a thermometer code, since it can be regarded as a thermometer in which the mercury column runs up and down. Therefore, there is only ever one bit more or one bit less than "logic one". All the least significant bits in this case are at the "logic 1" level. The shift register 30 used here with the thermometer code has the short loop and the long loop. The short loop is used for bit sequences 010 or 101, while, on the other hand, the long loop is used for 0011 or 1100 bit sequences. The decision as to whether to use the short loop or the long loop is made when switching the current source I7. In the long loop, the shift register 30 is always either filled entirely with "logic ones" or it is emptied entirely, all that is to say it is completely filled with "logic zeros". In the short loop, the shift direction is changed to position 5 and position 13, and the shifting process is suppressed for one clock cycle. In long loops, the shift direction can be changed for each rising edge of the modulation clock (in this case 1.152 MHz). The shift direction depends on the next bit to be modulated.

The shift direction decision is demonstrated once again in tabular form in FIG. 6.

FIG. 7 is a table showing the decision for using the long loop or the short loop.

In both FIGS. 6 and 7, TXDA(n) denotes the modulation bit, to be more precise the value of the modulation bit, at the time n, and TXDA(n+1) denotes the value of the modulation bit at the time n+1.

Overall, the present invention provides a digital GMSK filter in which there is no need for any separate digital filter, since the "filtering" is achieved just by the nonlinear weighting of the current sources I1 to I14. Driving the current sources I1 to I 14 via the shift register 30 with a thermometer code results in that only one current source is ever switched on or switched off in each case, so that this always results in a monotonal rise or fall in the output current. Individual weighting of the individual current sources allows sample values to be achieved with virtually no quantization error. No output buffer is required, since the currents can simply be added in a load resistor.

We claim:

1. A digital Gaussian minimum shift keying (GMSK) filter for frequency modulating a carrier signal in a GMSK transmission system, the GMSK filter comprising:
    a control logic module having a shift register receiving modulation bits, said shift register having a first side for receiving logic 1 values of the modulation bits and a second side receiving logic 0 values of the modulation bits, said second side being opposite said first side, said shift register having a shift direction switchable between a stop, a left and a right shift direction;
    a number of individual current sources outputting individual current values with said individual current sources being individually driven by said control logic module in accordance with a digital signal to be modulated; and
    an output resistor coupled to said individual current sources with a total current from said individual current sources being converted by said output resistor to a voltage value for controlling a voltage controlled oscillator, by which a frequency of the carrier signal is modulated.

2. The digital GMSK filter according to claim 1, wherein the individual current values of said individual current sources are weighted nonlinearly.

3. The digital GMSK filter according to claim 2, wherein the individual current values of said individual current sources are weighted such that the total current has a Gaussian characteristic, as a result of a respective connection and disconnection of in each case one of said individual current sources.

4. The digital GMSK filter according to claim 1, wherein said shift register is operable in a long loop mode, in which said shift register is always filled either entirely with "logic ones" or entirely with "logic zeros", and said shift register is operable in a short loop mode, in which the shift direction for specific positions in said shift register is changed, and a shift process is suppressed for one cycle.

5. The digital GMSK filter according to claim 4, wherein for the long loop mode in said shift register, the shift direction is changed as a function of a next bit to be modulated.

* * * * *